United States Patent [19]
Flesher et al.

[11] Patent Number: 5,703,755
[45] Date of Patent: Dec. 30, 1997

[54] FLEXIBLE ELECTRONIC CARD AND METHOD

[75] Inventors: H. Kelly Flesher; Albert P. Youmans, both of Los Gatos, Calif.

[73] Assignee: Aptek Industries, Inc., San Jose, Calif.

[21] Appl. No.: 852,676

[22] Filed: May 7, 1997

Related U.S. Application Data

[63] Continuation of Ser. No. 415,185, Apr. 3, 1995, abandoned.
[51] Int. Cl.$^6$ ............................................. H05K 1/14
[52] U.S. Cl. ..................... 361/737; 361/749; 361/736; 174/254; 439/67; 235/380
[58] Field of Search ............................... 361/736, 737, 361/742, 748, 749, 752, 758, 770, 728, 730, 760, 807, 809; 235/380, 492, 441, 439, 487, 488; 174/254, 255; 439/67, 68, 76.1

[56] References Cited

U.S. PATENT DOCUMENTS

| | | | |
|---|---|---|---|
| 5,227,339 | 7/1993 | Kishii | 437/225 |
| 5,412,192 | 5/1995 | Hoss | 235/380 |
| 5,544,014 | 8/1996 | Atsumi | 361/737 |

*Primary Examiner*—Leo P. Picard
*Assistant Examiner*—Phuong Vu
*Attorney, Agent, or Firm*—Flehr Hohbach Test Albritton & Herbert LLP

[57] ABSTRACT

A flexible electronic card for use with an electronic card reader including a flexible substrate formed of plastic. The card has dimensions such that it can fit into a conventional billfold. A flexible semiconductor device is carried by the flexible substrate and is accessible electronically by the electronic card reader. The card and the semiconductor device carried thereby can withstand bending over a 2" radius without breaking or damaging the semiconductor device.

8 Claims, 2 Drawing Sheets

+30.0 TO +20.0
+20.0 TO +10.0
+10.0 TO  0.0
  0.0 TO -10.0
-10.0 TO -20.0
-20.0 TO -30.0

FLEXIBLE ELECTRONIC CARD AND METHOD

This is a continuation of application Ser. No. 08/415,185 filed Apr. 3, 1995 now abandoned.

This invention relates to a flexible electronic card and a method for manufacturing the same.

Electronic cards often called Smartcards have heretofore been provided. Because of the increasing electronic requirements for such cards it has been necessary to use larger and larger semiconductor devices to perform the necessary electronic functions for the card. Typically the semiconductor devices utilized in such cards are formed of a rigid material as for example of silicon which resist bending and have a tendency to crack and break when the cards are bent by the user. There is therefore need for a new and improved flexible electronic card which can incorporate therein large semiconductor devices and in which the semiconductor devices can withstand severe punishment and will not break or fracture during the lifetime of the card.

In general, it is an object of the present invention to provide a flexible electronic card which can withstand the bending normally encountered during usage of the card without breaking or damaging the semiconductor device carried therein.

Another object of the invention is to provide a card and method of the above character in which the card and the semiconductor device incorporated therein can withstand bending over a radius of 2" or less without damage to or breaking of the semiconductor device carried therein.

Another object of the invention is to provide a card and method of the above character in which the semiconductor device is relatively stress free.

Another object of the invention is to provide a card and method of the above character in which the semiconductor device can be readily and economically manufactured.

Additional objects and features of the invention will appear from the following description in which the preferred embodiments are set forth in detail in conjunction with the accompanying drawings.

Figure 1:
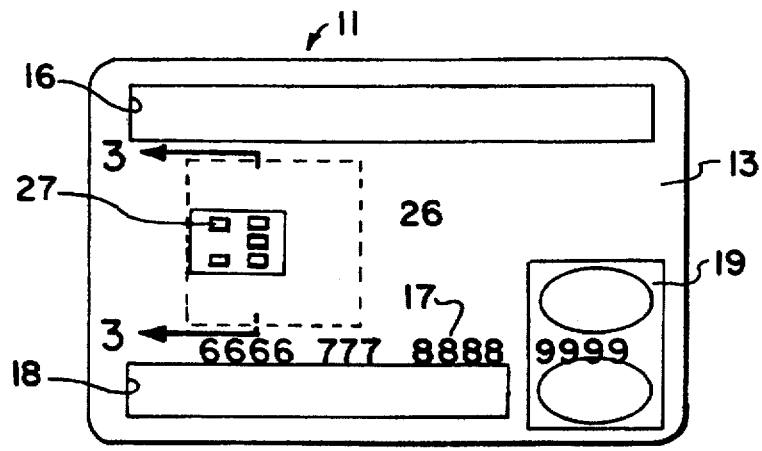
FIG. 1 is a plan view of the front side of the flexible electronic card incorporating the present invention.
Figure 2:
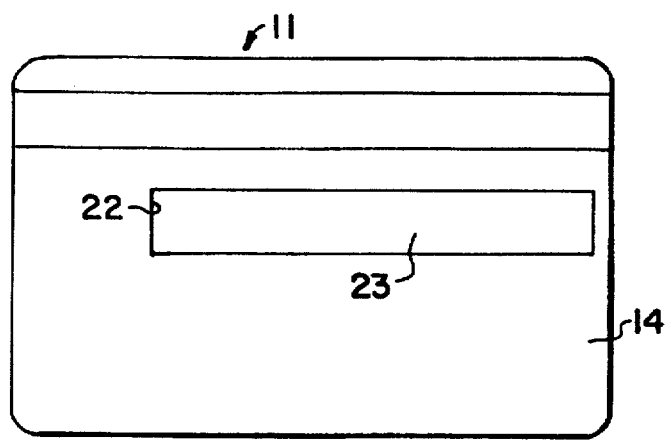
FIG. 2 is a plan view of the back side of the electronic card shown in FIG. 1.

In general, the flexible electronic card of the present invention is for use with an electronic card reader. It is comprised of a flexible substrate formed of a plastic and having dimensions such that it can fit into a conventional billfold. A flexible semiconductor device carried by the flexible substrate is accessible electronically by use of the electronic card reader. The electronic card is characterized in that the card and the semiconductor device carried thereby can withstand bending over a 2" radius or less without breaking or damaging the semiconductor device.

More specifically as shown in the drawings, the flexible electronic card 11 consists of a flexible substrate formed of a suitable plastic as for example polyethylene. It typically is sized so that it can fit within a conventional billfold. Thus it typically has a size having a length of 3⅜" and a width of 2⅛" and a thickness of 30 to 32 mils. In accordance with the present invention, this thickness can range from 10 to 40 mils. The plastic for making the card can be opaque or colored if desired. It is typically provided with many different types of indicia, some of which are visible to the human eye and some of which are invisible to the unaided human eye.

The substrate is provided with front and back sides 13 and 14 which are planar and parallel to each other. On the front side 13, there is provided a rectangular space 16 which can be utilized for placing the name of the card issuer. A card number 17 is carried by the card 11 which is visible to the user and typically is a number assigned to the user and can be imprinted on the card or embossed onto the plastic of the card. The card also can carry a rectangular space 18 in which certain information can be carried, as for example the name of the user embossed in the card as well as valid dates for the card and other desired information. Another rectangular space 19 is provided on the card which can carry additional identification, as for example the logo of the issuer as well as a holographic image to inhibit counterfeiting of the card. On the back side 14 of the card 11, a magnetic stripe 21 extends across the card and incorporates therein certain magnetically encoded information not visible to the user. It also includes a rectangular space below the magnetic stripe 21 which carries a strip 23 of the type which can be signed by the user of the card to provide an authorized signature for checking use of the card. The remaining space on the back of the card can be utilized for carrying other printed information which the issuer may wish to place on the card.

Figure 3:
FIG. 3 is a cross sectional view taken along the line 3—3 of FIG. 1.
Figure 4:
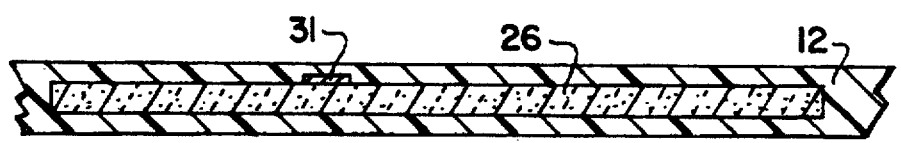
FIG. 4 is a cross sectional view similar to FIG. 3 but showing the use of a semiconductor device which is embedded within the card.

A semiconductor device 26 made in accordance with the present invention is carried by the flexible substrate 12 and as hereinafter explained can be completely embedded in the card or can have a portion thereof exposed through either the front or back surface of the card. The semiconductor device 26 carries means by which it can communicate with an electronic card reader of a conventional type which can make electrical contact with the card by physically making contact with a plurality of contacts 27 (see FIGS. 1 and 3) which are carried by the semiconductor device 26 and which are accessible through an opening 28 provided on the front side 13 of the card 11. Alternatively as shown in FIG. 4, contact can be made by an electronic card reader to the semiconductor device through other communication means as for example a radio frequency antenna in the form of a coil 31 carried by the semiconductor device 26 and embedded within the plastic forming the substrate 12.

In connection with the present invention, the semiconductor device utilized is of relatively large size to provide the desired electronic capabilities for the device. Typically it will have a minimum dimension ranging from 100 mils by 100 mils to as large as 1,000 mills by 1,000 mils.

In connection with the method of the present invention, the semiconductor device is fabricated from a silicon semiconductor wafer as for example having a diameter ranging from 4" to 8". Before utilization of the method of the present invention, the semiconductor circuits to be utilized in the semiconductor device have been formed in the front side of the wafer by conventional diffusion and evaporation processes well known to those skilled in the art and during which contact pads, as for example the contact pads 27 hereinbefore described, have been provided on the front surface of the wafer.

Let it be assumed that the circuitry making up the semiconductor devices formed in the wafer have been completed and that the wafer at this stage of processing has a thickness of 26 mils before back side grinding. Let it now be assumed that it is desired to thin the wafers by grinding the back side before dicing the wafers to form the desired semiconductor devices for the electronic card 11. Such thinner wafers are easier to dice and have improved thermal dissipation. Typically in the past such a grinding process induced stress in the wafer and caused it to warp. Such warped wafers are more likely to break during dicing. Warped dice are more difficult to mount and are prone to break and shatter particularly when they are flexed.

In accordance with the present invention in order to provide substantially stress free wafers after back side grinding, the wafers are mounted face down on circular metal plates used in connection with the grinder. These metal plates can have a suitable diameter, as for example 10½" and have a very planar surface. The wafer is mounted on a spinner. A lint-free laboratory paper (not shown) is then placed on the planar surface of the mounting plate. The lint-free laboratory paper has a suitable thickness, as for example 3 mils. Wax in the form of a synthetic resin dissolved in a liquid is poured into the center of the paper. The spinner is then actuated to achieve a uniform distribution of the wax over the paper. Any excess is purged. The wax cover plate is then heated until the liquid suspension solvent utilized in the wax has been evaporated and all bubbles are eliminated, as for example heating the plate to a temperature of 150° C. After the metal plate has been heated, the wafer with the circuit side down is placed over the waxed paper. The metal mounting plate is then placed in a cold plate press. The wafers are engaged by a rubber backing plate to which a relatively high pressure is applied, as for example 2500 lbs. of pressure on the 10 ½" plate which by way of example can carry four 4" wafers. This ensures that the wafers are firmly pressed against the mounting plate which has a very flat parallel surface. The mounting plate during this pressing operation can be subjected to cooling to ensure that the wax has solidified and holds the wafers firmly in place.

The mounted plates are then placed in a conventional grinder, as for example a Blanchard grinder. Appropriate calculations are made to determine the depth of the grind, taking care to include the thickness of the lint-free paper and the wax embedded therein, as for example a thickness of 3 mils to allow approximately ½ mil for polishing. The Blanchard grinder is then automatically set to remove the desired material from the back side, as for example descending from 26 to 8 mils in thickness.

After the grinding operation has been completed, the mounting plates with the wafers remaining mounted thereon are subjected to a polishing procedure by the use of a conventional polisher, as for example one applied by Strausbaugh and a polishing slurry. As the polishing operation continues, the thicknesses of the wafers are periodically measured until the desired thickness has been reached. After the desired thickness has been reached, the mounting plate with the wafers thereon can be removed from the polisher. In connection with the present method, it should be appreciated that both the grinding and polishing operations have been carried out on the wafer without removing the wafer or wafers from the mounting plate.

After the polishing has been completed, the mounting plates with the wafers thereon are placed on a hot plate until the temperature of the hot plate exceeds 150° C., at which time the wafers can be pried loose from the mounting plates utilizing tweezers. The wafers are placed in a Teflon boat. The wafers in the boat are introduced into a vapor zone of a vapor degreaser for a suitable period of time as for example one minute. The wafers are then rinsed in the liquid phase of the vapor degrester after which they are again subjected to another vapor zone treatment and another liquid phase in the vapor degreaser. The wafers are thereafter drained and cooled. The wafers are then placed on a vacuum chuck of a spinner. A cleaning solution is then introduced onto the exposed surface of the wafer. While the wafer is spinning, a sponge is utilized to scrub the wafer after which the wafer is rinsed with DI water and dried.

From the description of the method hereinbefore described, it can be seen that there is provided a "hot wax" method for securing the wafers during the grinding and polishing process. No photoresist or passivation layers are required to protect the surface of the wafers since the wafers are only mounted once on the mounting plate with the hot wax method. Thus, there is less wafer handling. As hereinafter explained, the method of the present invention makes it possible to produce wafers with back side grinding that are very thin and which have less stress by a factor of 10 than with conventional grinding and polishing methods. The method is also advantageous in that it tolerates the use of gold bumps and high ink dot materials on the semiconductor devices. The present method can be utilized for grinding wafers from 8" (50–200 millimeters) diameter to thicknesses down to 5 mils (1.25 millimeters) and even as low as 3 mils with a tolerance of plus or minus one-half mil (0.0125 millimeters).

Figure 5:
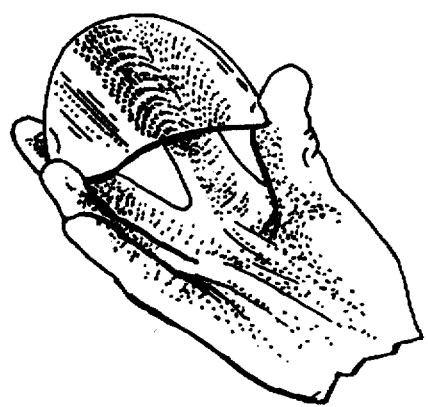
FIG. 5 is a perspective view showing the manner in which a semiconductor wafer manufactured in accordance with the method of the present invention can be bent over a radius of 2" or less without breaking or fracturing.

After the grinding and polishing operations hereinbefore described have been completed, the wafers can be diced in a conventional manner to provide individual dice which serve as semiconductor devices in the present invention. The semiconductor wafers that have been back ground in accordance with the present invention and before they are die cut can be bent over a radius of 2" or less without fracturing or breaking as illustrated by the perspective view shown in FIG. 5. This is an important characteristic of the wafers manufactured in accordance with the present invention because it ensures that the die made therefrom are also flexible and will not fracture or break when embedded in the flexible electronic card of the present invention.

Figure 6:
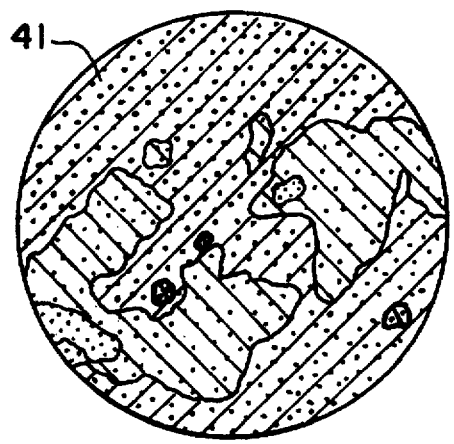
FIG. 6 is a radial stress map of a wafer which has been ground in accordance with the method of the present invention.

A radial stress map of a wafer made in accordance with the present invention is shown in FIG. 6 and shows the stresses induced on a wafer having a diameter of 158 millimeters with the analysis being done on a Tencor FLX laser cantilever beam system at a viewing angle of 90°. The units on the map as shown in FIG. 6 are in MPa×μm (stress-times-thickness). The actual stress layer thickness is 10 μm and the stress value in MPa is equal to the values in the map divided by 10. The wafer 41 shown in the drawing had thicknesses of 18 mils and a diameter of 158 millimeters. The wafer had the following statistics:

Film Thickness—10,000 A°

Average:+1.86

Minimum+27.32

Maximum–25.71

Standard Deviation: 3.84

Viewing Angle: 90°

From the order of stress for the wafer shown in FIG. 6 which has been back-side ground in the manner hereinbefore described, had a scale for stress which is at least one order of magnitude lower than for conventional wafers which have been back-side ground. In addition, the relative smoothness of the sawed edge of the polished wafers which have been back side ground and polished in the manner hereinbefore described is less than 2 microns peak-to-peak versus 4+ microns peak-to-peak for prior art methods. The radial stress map shown in FIG. 6 shows that at least 80% of the die cut from the wafer will be relatively stress free in comparison to approximately 30% for wafers which have their back grinding accomplished by conventional back grinding methods.

Figure 7:
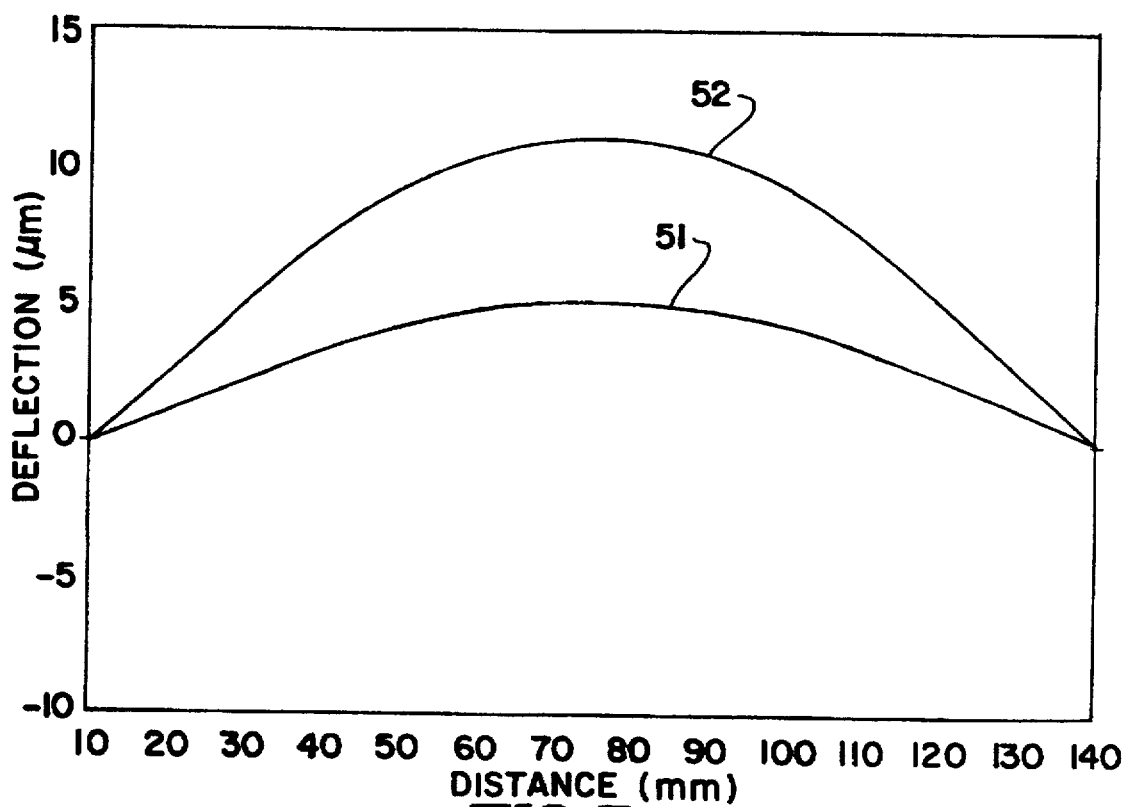
FIG. 7 is a graph showing the shape of a wafer utilized in the present invention before and after grinding.

In FIG. 7 there is a graph showing deflection of a wafer ground in accordance with the present invention from 26.5 mils to 18 mils. The deflection is measured from a three-point support for the wafer at its outer periphery. The solid line 51 represents deflection of the wafer at 26.5 mils in thickness before grinding due to its self weight with deflection being approximately 5 μm whereas the solid line 52 represents deflection of the wafer due to its self weight after grinding the thickness down to 18 mils with the deflection being approximately 12 micrometers. In ascertaining these deflections, the deformation of the substrate was ascertained by a film deposited thereon to measure the film stress. As is well known to those skilled in the art, stresses can be calculated by equating the forces and moments of the film and the substrate.

From the foregoing, it can be seen that a method has been provided in the present invention which results in much higher die yields per wafer and therefore makes it possible to produce semiconductor die at lower prices to result in dramatic cost savings. In addition, the devices made in accordance with the invention are relatively stress free and therefore can be bent through a substantial angle as for example an angle corresponding to a 2" radius without fracturing or breaking. Utilizing the same principles is possible to manufacture die having a thickness from 2 to 7 mils and certainly within 4 to 5 mils so that they can be readily encapsulated in flexible plastic substrate of the type hereinbefore described to provide the flexible electronic card of the present invention. The semiconductor device utilized can have large storage capabilities and large computation capabilities. Since the wafers made in accordance with the present invention are relatively stress free, it dices very well and the resultant die are tough enough to withstand extreme punishment when embedded in a plastic substrate utilized for flexible electronic cards. Thus for example, such electronic cards can be carried in a billfold and can withstand repeated bending which can occur in a billfold carried in the back pocket of the pants of a wearer.

What is claimed is:

1. A flexible electronic card for use with an electronic card reader comprising a flexible substrate formed of plastic and having dimensions of approximately 3⅜" by 2⅛" such that it can fit into a conventional billfold, a flexible semiconductor device having an area greater than 100 mils by 100 mils carried by the flexible substrate; and being accessible electronically by the electronic card reader characterized in that the; card and the semiconductor device carried thereby can withstand bending over a 2" radius without breaking or damaging the semiconductor device, said semiconductor device having edges and having a substantially uniform thickness in the range of 2 to 7 mils and being free of tapered edges, said semiconductor device having a back surface; that is ground and polished with peak-to-peak variations of less than 2 microns to provide a semiconductor device with substantially reduced stress.

2. A card as in claim 1 wherein said semiconductor device has a thickness from 3 to 5 mils.

3. A card as in claim 2 wherein said semiconductor device has an area as great as 1000 mils by 1000 mils.

4. A card as in claim 1 wherein said card has a thickness of 30–32 mils.

5. A card as in claim 1 wherein said semiconductor device carries contact pads and wherein said substrate is provided with an opening overlying the contact pads so that the contact pads are accessible to the electronic card reader.

6. A card as in claim 1 wherein said card is embedded in the said plastic substrate and wherein said card is provided with a radio frequency antenna for conveying information by radio frequency from and to the electronic card reader.

7. A card as in claim 1 wherein said semiconductor device is substantially stress free.

8. A flexible electronic card for use with an electronic card reader comprising a flexible substrate formed of plastic, a flexible semiconductor device carried by the flexible substrate and being accessible electronically by an electronic card reader characterized in that the semiconductor device has edges and has a substantially uniform thickness free of tapered edges in the range of 2 to 7 mils and has been selected from a semiconductor wafer having front and back sides with a plurality of semiconductor devices in the front side and in which the back side has peak-to-peak variations of less than 2 microns treated by the steps of providing a mounting plate having a planar flat surface, placing lint-free tissue paper on the planar flat surface, placing a wax on the lint-free paper and spinning the metal plate to cause a uniform distribution of the wax in the lint-free paper, placing the front side of the wafer against the lint-free paper, compressing the wafer against the lint-free paper while subjecting the mounting plate to heat in excess of 250° C., coating the mounting plate grinding the back side of the wafer while it is supported by the mounting plate to reduce the thickness of the semiconductor wafer to a predetermined thickness, polishing the back side after the grinding operation has been utilizing the same mounting plate without removing the wafer from the mounting plate to further reduce the thickness of the wafer to a predetermined thickness, heating the mounting plate, removing the wafer from the mounting plate, removing the wax from the front surface of the wafer, cleaning the wafer, die cutting the wafer to provide an individual semiconductor die for use on the substrate to provide an electronic card which can withstand extreme punishment and which can withstand bending over a 2-inch radius or less without breaking or damage to the semiconductor device.

\* \* \* \* \*

UNITED STATES PATENT AND TRADEMARK OFFICE
CERTIFICATE OF CORRECTION

PATENT NO. : 5,703,755

DATED : December 30, 1997

INVENTOR(S) : FLESHER, et al.

It is certified that error appears in the above-indentified patent and that said Letters Patent is hereby corrected as shown below:

Column 4, line 57, after "sawed", delete "edge of" and substitute therefor --edges die cut from --.

Column 5, line 56: after "device having" insert --sawed--.

Column 6, line 3: delete "with" and substitute therefor --so that it has sawed edges with--.

Column 6, line 28, before "edges" insert --sawed--.

Column 6, line 28: after "edges" insert --having peak-to-peak variations of less than 2 microns --.

Column 6, lines 32-33, delete "peak-to-peak variations of less than 2 microns" and substitute therefor --been--.

Signed and Sealed this

Twenty-sixth Day of May, 1998

Attest:

BRUCE LEHMAN

*Attesting Officer*    *Commissioner of Patents and Trademarks*